(12) United States Patent
Kajakine et al.

(10) Patent No.: US 10,727,800 B2
(45) Date of Patent: Jul. 28, 2020

(54) METHOD FOR GAIN CONTROL AND RELATED WIRELESS RECEIVERS AND DEVICES

(71) Applicant: Telefonaktiebolaget LM Ericsson (publ), Stockholm (SE)

(72) Inventors: Nikolai Kajakine, Turku (FI); Peter Jakobsson, Lund (SE); Victoria Slavinskaya, Lund (SE)

(73) Assignee: Telefonaktiebolaget L M Ericsson (publ), Stockholm (SE)

( * ) Notice: Subject to any disclaimer, the term of this patent is extended or adjusted under 35 U.S.C. 154(b) by 93 days.

(21) Appl. No.: 15/556,774

(22) PCT Filed: Mar. 20, 2015

(86) PCT No.: PCT/EP2015/055998
§ 371 (c)(1),
(2) Date: Sep. 8, 2017

(87) PCT Pub. No.: WO2016/150470
PCT Pub. Date: Sep. 29, 2016

(65) Prior Publication Data
US 2018/0062602 A1 Mar. 1, 2018

(51) Int. Cl.
*H03G 3/30* (2006.01)
*H03G 3/00* (2006.01)

(52) U.S. Cl.
CPC ........... *H03G 3/3068* (2013.01); *H03G 3/008* (2013.01); *H03G 3/3078* (2013.01); *H03G 3/3089* (2013.01)

(58) Field of Classification Search
CPC .. H03G 3/3068; H03G 3/3036; H03G 3/3052; H03G 3/20; H03G 3/3042;
(Continued)

(56) References Cited

U.S. PATENT DOCUMENTS 8,548,410 B2 10/2013 Jussila et al.
8,606,194 B2 12/2013 Kaukovuori et al.
(Continued)

FOREIGN PATENT DOCUMENTS

CN 101714970 A 5/2010
CN 102365821 A 2/2012
(Continued)

OTHER PUBLICATIONS

Ericsson et al., "R4-115583: Scenarios for non-contiguous intra-band CA," 3rd Generation Partnership Project (3GPP), TSG-RAN WG4 Meeting #61, Nov. 14-18, 2011, 7 pages, San Francisco, California, USA.
(Continued)

*Primary Examiner* — David C Payne
*Assistant Examiner* — Sarah Hassan
(74) *Attorney, Agent, or Firm* — Withrow & Terranova, PLLC

(57) ABSTRACT

This disclosure provides a method for gain control in a wireless receiver. The wireless receiver comprises a first receiver chain adapted to receive a first signal in a first frequency range, a second receiver chain adapted to receive a second signal in a second frequency range, and a common amplifier module operatively connected to the first receiver chain and the second receiver chain. The method comprises determining a first target gain level for a first path comprising the common amplifier module and the first receiver chain, and determining a second target gain level for a second path comprising the common amplifier module and the second receiver chain. The method comprises setting a gain GA of the common amplifier module and a gain GRx1 in the first receiver chain and a gain GRx2 in the second receiver chain based on the first target gain level and the second target gain level.

19 Claims, 5 Drawing Sheets

(58) Field of Classification Search
CPC ........ H03G 3/00; H03G 3/008; H03G 3/3089; H03G 3/002
USPC .......................................... 375/130; 348/685
See application file for complete search history.

(56) References Cited

U.S. PATENT DOCUMENTS

| | | | |
|---|---|---|---|
| 2006/0234649 A1* | 10/2006 | Okada | H04B 1/403 455/76 |
| 2007/0117507 A1* | 5/2007 | Wakayama | H03D 3/008 455/3.02 |
| 2011/0274224 A1 | 11/2011 | Aznar et al. | |
| 2013/0045704 A1 | 2/2013 | Kaukovuori et al. | |
| 2013/0130635 A1* | 5/2013 | Kaukovuori | H04B 1/16 455/226.1 |
| 2013/0130637 A1 | 5/2013 | Kaukovuori et al. | |
| 2014/0126401 A1 | 5/2014 | Motamed et al. | |
| 2015/0087245 A1 | 3/2015 | Hadji-Abdolhamid et al. | |

FOREIGN PATENT DOCUMENTS

| | | |
|---|---|---|
| CN | 102404267 A | 4/2012 |
| CN | 102821453 A | 12/2012 |
| WO | 2013072864 A1 | 5/2013 |
| WO | 2014049005 A1 | 4/2014 |

OTHER PUBLICATIONS

International Search Report and Written Opinion for International Patent Application No. PCT/EP2015/055998, dated Nov. 2, 2015, 10 pages.

Author Unknown, "Technical Specification Group Radio Access Network; Evolved Universal Terrestrial Radio Access (E-UTRA); User Equipment (UE) radio transmission and reception (Release 11)," Technical Specification 36.101, Version 11.7.0, 3GPP Organizational Partners, Dec. 2013, 492 pages.

Hwu, Sy-Chyuan et al, "An RF Receiver for Intra-Band Carrier Aggregation," IEEE Journal of Solid-State Circuits, vol. 50, Issue 4, Apr. 2015, IEEE, pp. 946-961.

Kaho, Takana et al., "A Simultaneous Receiving Multi-band Mixer with Independent Gain Control," Proceedings of the Asia-Pacific Microwave Conference, Dec. 5-8, 2011, Melbourne, VIC, USA, IEEE, pp. 383-386.

NTT Docomo, Inc, "R4-143036: Power imbalance level for additional requirement," 3rd Generation Partnership 3roject (3GPP), TSG-RAN WG4 Meeting #71, May 19-23, 2014, 3 pages, Seoul, Republic of Korea.

International Preliminary Report on Patentability for International Patent Application No. PCT/EP2015/055998, dated Oct. 5, 2017, 8 pages.

Search Report and Office Action for Chinese Patent Application No. 201580078043.4, dated Jun. 2, 2020, 20 pages.

* cited by examiner

US 10,727,800 B2

METHOD FOR GAIN CONTROL AND RELATED WIRELESS RECEIVERS AND DEVICES

This application is a 35 U.S.C. § 371 national phase filing of International Application No. PCT/EP2015/055998, filed Mar. 20, 2015, the disclosure of which is incorporated herein by reference in its entirety.

TECHNICAL FIELD

The present disclosure pertains to the field of wireless communications. More particularly the present disclosure relates to methods for gain control in a wireless receiver, related wireless receivers and devices.

BACKGROUND

A user equipment, UE 600, in a wireless communication system, as depicted in FIG. 1, can receive signals from a plurality of base stations, e.g. signals from a base station, BS, 101 and signals from a base station 110. The signals from BS 101 and the signals from BS 110 are transmitted using different frequency ranges, as for example in 3rd Generation Partnership Project, 3GPP, Long Term Evolution, LTE, Advanced with carrier aggregation, CA, or with dual connectivity.

The BSs may not be co-located, particularly when operating in non-contiguous, NC, CA mode, and due to transmission loss, the UE 600 experiences a received signal power for signals from BS 101, that may be different than for signals from BS 110. For example in CA, the UE observes different power levels for component carriers from BS 101 and for component carriers from BS 110. The UE 600 is capable of performing automatic gain control to improve the processing of the received signals.

However, many issues arise when attempting to perform automatic gain control for processing signals received at different frequency ranges, especially when signals received from different frequency ranges or BSs are processed using a partially common path, e.g. comprising one or more common hardware resources for the sake of reducing receiver hardware complexity and reducing power consumption.

WO2013072864 discloses a receiver comprising two branches with corresponding quadrature mixers and bandpass filters for reception of non-contiguous carrier aggregation signals. WO2013072864 discloses that two branches may be configured to having independent gain. The LNA gain may be increased to improve sensitivity if both branches are used. US20140126401 discloses an amplifier which is used to apply a common gain to aggregated carriers in a single frequency band. A common gain is determined as a function of indications of received signal quality associated with groups of aggregated carriers containing one or more of the aggregated carriers. Applying a common gain to aggregated carriers in a single frequency band may be sufficient to avoid clipping of the received signals. However, this approach may not be sufficient to reach e.g. a signal to noise ratio, SNR, necessary for errorless demodulations of signals received on both frequency ranges. Thus, US2014126401 is most likely resulting in a suboptimal processing of received signals on one of frequency ranges.

There is a need for improved solutions for gain control in a wireless receiver taking into consideration factors such as target signal quality on different frequency ranges, the desire to avoid clipping of the received signals and the need to reduce power consumption.

SUMMARY

An object of the present disclosure is to provide methods, wireless receivers, controller modules, and wireless devices which seek to mitigate, alleviate, or eliminate one or more of the above-identified deficiencies in the art and disadvantages singly or in any combination.

This object is obtained by a method for gain control in a wireless receiver. The wireless receiver comprises a first receiver chain adapted to receive a first signal in a first frequency range, a second receiver chain adapted to receive a second signal in a second frequency range, and a common amplifier module operatively connected to the first receiver chain and the second receiver chain. The method comprises determining a first target gain level for a first path comprising the common amplifier module and the first receiver chain, and determining a second target gain level for a second path comprising the common amplifier module and the second receiver chain. The method comprises setting a gain GA of the common amplifier module and a gain GRx1 in the first receiver chain and a gain GRx2 in the second receiver chain based on the first target gain level and the second target gain level.

Hereby, the present disclosure provides an optimized gain control for different frequency ranges (such as for LTE non-contiguous intra-band CA modes and for inter-band CA modes, and for LTE with dual connectivity) by determining two target gain levels achievable by setting gains in variable gain points in the wireless receiver (i.e. the common amplifier module, the first receiver chain and the second receiver chain). This provides an improved processing of the received signals that achieves target signal quality on different frequency ranges with a reduced power consumption and avoids clipping of the received signals.

According to some aspects, the step of determining the first target gain level and the step of determining the second target gain level are based on one or more of power measurements, signal quality measurements and signal to interference level measurements for each receiver chain.

According to some aspects, setting the gain GA of the common amplifier module and the gain GRx1 in the first receiver chain and the gain GRx2 in the second receiver chain based on the first target gain level and the second target gain level comprises determining whether the first and second target gain levels are obtainable by setting the gain GA, the gain GRx1, and the gain GRx2 within a predetermined operating gain range of the common amplifier module, a predetermined operating gain range of the first receiver chain and a predetermined operating gain range of the second receiver chain respectively.

The present disclosure hereby allows satisfying minimum requirement specifications (such as a minimum throughput) for signals received in each of the frequency ranges, and requirements related to the operating gain ranges of the various modules involved. Thus, the present disclosure does not require increasing the operating gain range of a module or receiver chain in the wireless receiver to satisfy the throughput requirements. The present disclosure thereby permits maintaining low power consumption of the modules or receiver chains, such as of the common amplifier module and of the first and second receiver chain.

The present disclosure relates a wireless receiver. The wireless receiver comprises a front end module, and a common amplifier module operatively connected to the front end module. The wireless receiver comprises a first receiver chain operatively connected to the common amplifier module to receive a first signal in a first frequency range; and a second receiver chain operatively connected to the common amplifier module to receive a second signal in a second frequency range. Each of the common amplifier module and the first and second receiver chains has a variable gain. The wireless receiver further comprises a controller module adapted to determine a first target gain level for a first path comprising the common amplifier module and the first receiver chain and a second target gain level for a second path comprising the common amplifier module and the second receiver chain. The controller module is adapted to set a gain GA of the common amplifier module and a gain GRx1 in the first receiver chain and a gain GRx2 in the second receiver chain based on the first target gain level and the second target gain level.

Hereby, the present disclosure provides a wireless receiver that optimally process signals from two frequency ranges with a reduced hardware complexity by implementing a common amplifier module and two or more receiver chains.

There is also disclosed herein a controller module for use in the wireless receiver according to some aspects, adapted to carry out any of the methods according to some aspects.

This disclosure also relates to a computer program product comprising a computer readable medium having thereon a computer program for use in the controller module according to some aspects comprising code to enable the controller module to carry out any of the method steps disclosed herein.

Further aspects of the present disclosure are disclosed in the detailed description.

The wireless receivers, the controller modules and the computer programs provide advantages corresponding to the advantages already described in relation to the method.

BRIEF DESCRIPTION OF THE DRAWINGS

The foregoing will be apparent from the following more particular description of the example embodiments, as illustrated in the accompanying drawings in which like reference characters refer to the same parts throughout the different views. The drawings are not necessarily to scale, emphasis instead being placed upon illustrating the example embodiments.

DETAILED DESCRIPTION

Figure 1:
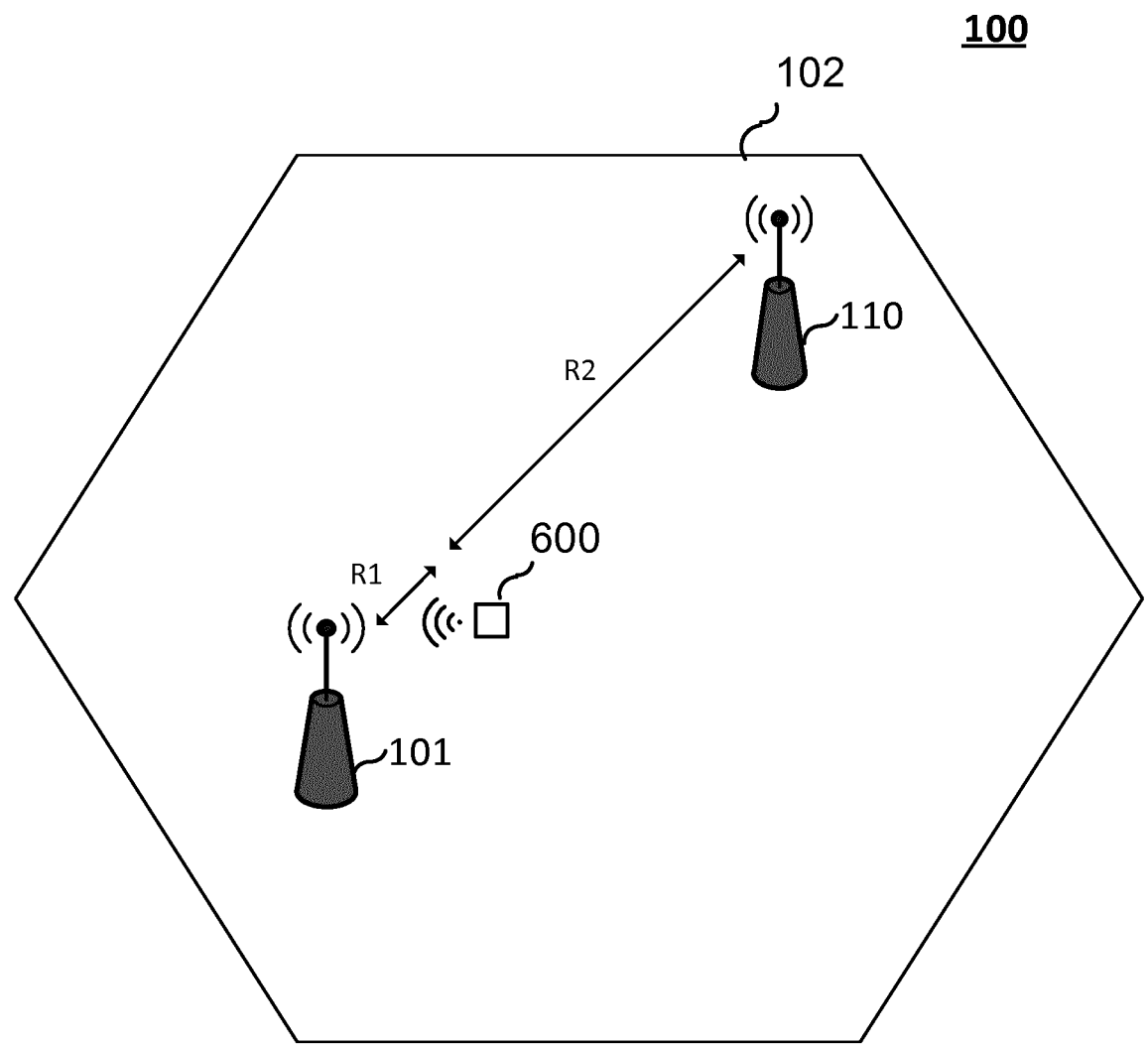
FIG. 1 is a wireless communication system according to some aspects of the present disclosure.

The present teaching relates to controlling a gain of one or more modules processing signals received in different frequency ranges. The present technique is applicable to electronic systems as well as wireless communication systems where gain control is necessary to achieve a target quality.

Herein, gain control is to be construed as setting a gain of one or more modules processing an input signal so as to provide a controlled output signal amplitude despite variations of the amplitude in the input signal. The term "gain" of a module as used herein refers to a ratio of the output amplitude or power of the module to the input amplitude or power of the module, such as a ratio between the amplitude or power of an output signal and the amplitude or power of an input signal.

As mentioned in the background section, automatic gain control can be performed to improve the processing of the received signals. Namely, automatic gain control keeps a module's output level from fluctuating too much by detecting the overall strength of the received signal and automatically adjusting the gain of the module to maintain the output level within an acceptable range. For a weak input signal, the automatic gain control increases the gain set at the module up to a maximum gain while the automatic gain control reduces the gain set at the module when the input signal strength increases. The gain varies depending on the signal strength of the input signal. In a wireless receiver, the received signal has a dynamic range greater than the operating range of a module of the wireless receiver (such as the analog-to-digital converter, ADC, module); the automatic gain control is arranged to ensure a sufficient signal-to-noise ratio, SNR, without clipping the received signal.

However, many issues arise when attempting to perform automatic gain control for processing signals received at different frequency ranges (as in e.g. LTE CA or dual connectivity). It becomes difficult to achieve a target SNR for each frequency range and maintain the received signal within an acceptable operating gain range of each of the modules present in the processing path at the wireless receiver. This is especially difficult when signals received from both frequency ranges are processed using a partially common path or a common hardware resource for the sake of reducing receiver hardware complexity. Considering the example of FIG. 1, the wireless communication device 600 determines that the gain at the common module is to be adjusted according to a power level of signals received in a first frequency range (e.g. −25 dBm) from the first network node 101 to avoid clipping in a common module. The gain is in this example to be decreased to a minimum value, which results in an increase in the receiver noise figure. The same gain is for example set in the common module that processes signals received in a second frequency range used by the second network node 110, which is not sufficient to reach an SNR level necessary for errorless demodulations of the signals received in the second frequency range (e.g. with −72 dBm . . . −70.2 dBm levels) due to a high level of the receiver noise figure.

Thus, there are conflicts in attempting to achieve a target SNR for each frequency range and to maintain the gain within an acceptable operating gain range of each module processing signals received in the first and second frequency ranges. The present disclosure provides methods to solve these conflicts with minimal difference between the requirements and the achievable gains.

The various wireless receivers and controller modules referred to herein are according to different aspects implemented as e.g. application-specific integrated circuit, ASIC, field-programmable logic array, FPGA, or general purpose processor.

Aspects of the present disclosure will be described more fully hereinafter with reference to the accompanying drawings. The wireless receiver, the controller module, the wireless communication device, and the method disclosed herein can, however, be realized in many different forms and should not be construed as being limited to the aspects set forth herein. Like numbers in the drawings refer to like elements throughout.

The terminology used herein is for the purpose of describing particular aspects of the disclosure only, and is not intended to limit the invention. As used herein, the singular forms "a", "an" and "the" are intended to include the plural forms as well, unless the context clearly indicates otherwise.

FIG. 1 shows a wireless communication system 100 according to the present disclosure. The wireless communication system 100 comprises a wireless communication device 600 according to aspects of this disclosure and a first network node 101 that is adapted to transmit and receive signals to/from the wireless communication device 600 in a coverage area 102, such as a cell. The wireless communication system 100 is for example a 3GPP Long Term Evolution, LTE or LTE-Advanced system, the fourth-generation mobile communication technologies standard developed within the 3rd Generation Partnership Project, 3GPP, to improve the Universal Mobile Telecommunication System, UMTS, standard to cope with future requirements in terms of improved services such as higher data rates, improved efficiency, and lowered costs. In a typical cellular radio system, the wireless communication device 600 communicates via a radio access network, RAN, to one or more core networks. The Evolved Universal Terrestrial Radio Access Network, E-UTRAN, is the radio access network of an LTE system. The first network node 101 is a radio access network node capable of transmitting radio signals to a wireless communication device 600 and receiving signals transmitted by the wireless communication device 600. The first network node 101 is commonly referred to as a base station, BS, or an evolved NodeB, eNB or eNodeB in LTE. The wireless communication device 600 is for example a user equipment, UE, or a mobile station. The UE or mobile station comprises e.g. a cellular phone, a personal digital assistant, a wireless modem, a handheld device, a tablet device, a laptop computer, Machine to Machine, M2M, devices and other mobile entities. However, one must appreciate that capability to communicate with a wireless communication system could be built in almost any device e.g. a car, a lamp post, etc.

The wireless communication device 600 is adapted to communicate with the first network node 101, and a second network node 110. The second network node 110 is a radio access network node (e.g. a BS, or an eNB) capable of transmitting radio signals to a wireless communication device 600 and receiving signals transmitted by the wireless communication device 600. The second network node 110 operates for example using a frequency range different from the frequency range used by the first network node 101. For example, in LTE-Advanced with carrier aggregation, the first network node 101 and the second network node 110 use different component carriers to communicate to the device 600. It is envisaged for example, that the first network node 101 operates using primary component carrier, while the second network node 110 operates using secondary component carrier. According to some aspects, the primary component carrier and the secondary component carrier are at non-contiguous frequencies in the same frequency band, which is referred to as intra band non-contiguous carrier aggregation. According to some aspects, the primary component carrier is in a first frequency band and the secondary component carrier is in a second frequency band, which is referred to as inter band carrier aggregation. It is also envisaged that for example, the first network node 101 operates in a macro cell, while the second network node 110 operates in a smaller or low-power cell, such as a micro cell, a pico cell, or a femto cell. For example, in LTE-Advanced with dual connectivity, the wireless communication device 600 connects to the first network node 101 controlling a macro cell 102 and to the second network node 110 controlling a smaller or low-power cell than cell 102 (e.g. any of a micro cell, a pico cell, and a femto cell). In dual connectivity, the wireless communication device 600 has simultaneous connections to both macro and low-power layers. The control signaling for mobility is for example provided via the macro cell or layer (using the first network node 101) at the same time as high-speed data connectivity is provided via the low-power cell or layer (using the second network node 110).

Figure 2:
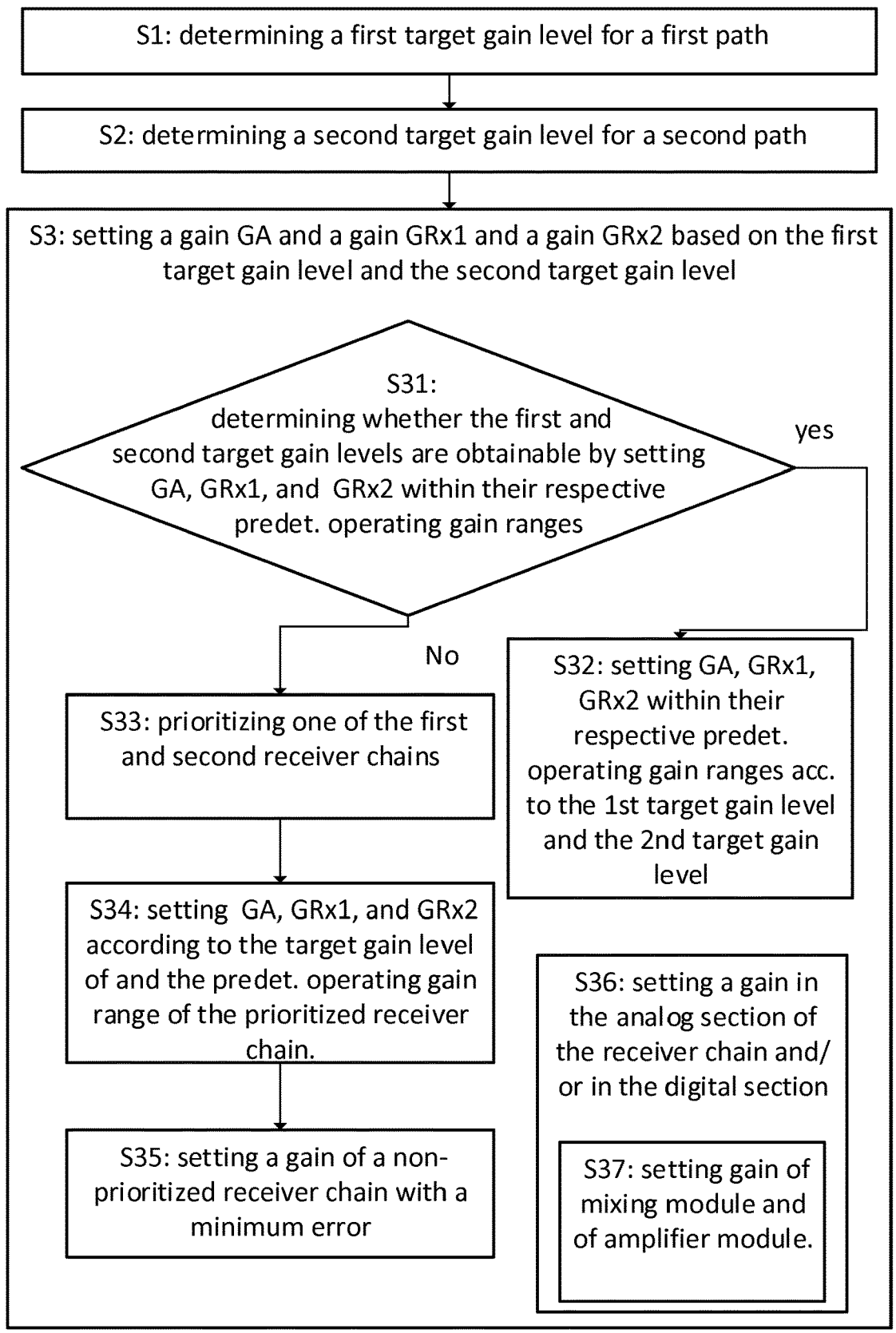
FIG. 2 is a flowchart illustrating methods performed at a wireless receiver according to some aspects of this disclosure.
Figure 3:
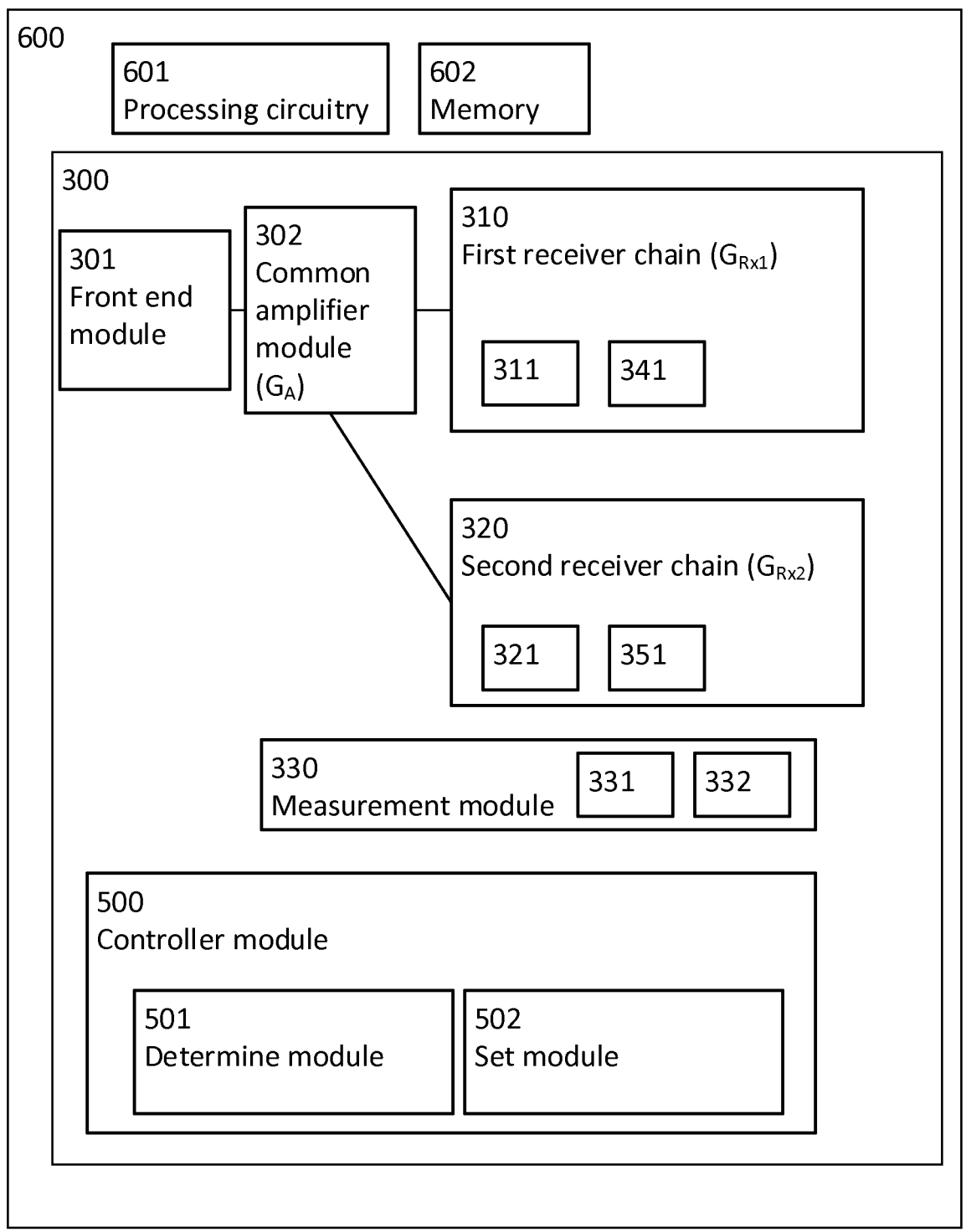
FIG. 3 is a block diagram illustrating a wireless communication device comprising a wireless receiver according to some aspects of the present disclosure.

As illustrated in FIG. 1, the wireless communication device 600 is for example located at a distance R1 from the first network node 101, and at a distance R2 from the second network node 110. Due to space transmission loss or path loss, the received signal power at device 600 is inversely proportional to a power of the distance to the transmitting network node, such as proportional to $R^{-2} \ldots R^{-4}$, where R is a distance between a transmitting network node and a receiving device 600. The device 600 may observe different power level for signals received from the first network node 101 and from the second network node 110. Depending on the distance between the transmitting network node and the receiving device, signals are received with low, acceptable or high power. The device 600 is adapted to perform gain control so as to improve the processing of the signals received from the first network node 101 and the second network node 110, while avoiding clipping of the received signals. FIG. 2 shows methods 200 for gain control according to aspects of the present disclosure. The gain control is performed for a signal received by a wireless receiver. Since the received signal has a dynamic range greater than the operating range of a module in the receiver (such as the analog-to-digital converter module), a gain control is needed to ensure a sufficient signal-to-noise ratio without clipping the received signal. The methods 200 are performed at a wireless receiver, such as wireless receiver 300 of FIG. 3, or at a wireless communication device comprising a wireless receiver. As shown in FIG. 3, the wireless receiver 300 comprises a first receiver chain 310 adapted to receive a first signal in a first frequency range, a second receiver chain 320 adapted to receive a second signal in a second frequency range, and a common amplifier module 302 operatively connected to the first receiver chain 310 and the second receiver chain 320. The first frequency range corresponds for example to primary component carrier, while the second frequency range corresponds for example to secondary component carrier. According to some aspects, the primary component carrier and the secondary component carrier are at non-contiguous frequencies in the same frequency band, which is referred to as intra band non-contiguous carrier aggregation. According to some aspects, the primary component carrier is in a first frequency band and the secondary component carrier is in a second frequency band, which is referred to as inter band carrier aggregation. The first receiver chain 310 is adapted to receive a first signal in a first frequency range such as from a first network node. A second receiver chain 320 is adapted to receive a second signal in a second frequency range, such as from a second network node. The first network node 101 operates for example in a macro cell, while the second network node 110 operates in a smaller cell, such as a micro cell, a pico cell, or a femto cell. The wireless receiver 300 is thus adapted to process received signals in wireless communication systems such as LTE-Advanced with carrier aggregation, and/or with dual connectivity. The wireless receiver 300 is adapted to operate in for example LTE-Advanced with carrier aggregation in frequency division duplex, FDD, and/or time division duplex, TDD.

The method 200 comprises determining S1 a first target gain level for a first path comprising the common amplifier module 302 and the first receiver chain 310. For example, the step of determining S1 comprises determining or calculating, for signals received over the first frequency range, the first target gain level for a combination of the common amplifier module 302 and the first receiver chain 310. In other words, the first target gain level is calculated aiming to achieve a certain power level, or signal scale, in time or frequency domain for the first signals received in the first frequency range. For example, determining S1, S2 the first and/or second target gain level comprises determining the first and/or second target gain level such that an amplitude of the input signal to a module in the first and/or second receiver chain (such as an analog-to-digital converter module) is sufficiently high compared to a quantization noise, but not excessively high to avoid clipping of the input signal.

The method 200 comprises determining S2 a second target gain level for a second path comprising the common amplifier module 302 and the second receiver chain 320. For example, the step of determining S2 comprises determining the second target gain level for a combination of the common amplifier module 302 and the second receiver chain 320, such as determining the second target gain level for signals received over the second frequency range. The second target gain level is determined so as to achieve a certain power level in time or frequency domain for the second signals received in the second frequency range.

According to some aspects, the step of determining S1 the first target gain level and the step of determining S2 the second target gain level are based on one or more of power measurements, signal quality measurements and signal to interference level measurements for each receiver chain 310, 320. For example, determining S1, S2 the first target gain level and the second target gain level comprises obtaining one or more of power measurements, signal quality measurements and signal to interference level measurements for each receiver chain 310, 320, such as for each of the first and second frequency range. According to some aspects, the one or more of power measurements, signal quality measurements and signal to interference level measurements for each receiver chain 310, 320, are obtained from a measurements module 330. First and second power measurements are for example performed before or after an analog-to-digital converter module comprised in the first receiver chain and the second receiver chain, and provided to determine the first target gain level and the second target gain level respectively. For example, in a LTE receiver, power measurements may be done in frequency domain and comprise reference signals received power, RSRP, reference signals received quality, RSRQ, measurements, and/or reference symbol resource element received power measurements. The reference symbol resource element received power is defined as an unfiltered power located at resource elements containing reference signals, averaged over one sub-frame. The measurements for RSRP are for example performed after synchronized detection of the reference signals, including equalization and multiplication by conjugate reference signals for a cell. According to some aspects, RSRP measurements are used to determine the target gain levels when the RSRQ measurements are satisfactory. In general, power measurements in frequency domain may comprise averaging over signals such as cell specific reference signals, UE specific reference signals, channel state information, CSI, reference signals, control channel signals, and/or multicast-broadcast single-frequency network, MBSFN, reference signals in case of their reception.

Signal quality measurements comprise for example measurements of an indicator of the input signal strength, such as a received signal strength indicator, RSSI. Determining S1, S2 the first target gain level and/or the second target gain level comprises for example calculating the first and/or second target gain level based on the RSSIs of the first and second signals respectively, and taking into account how much noise figure is allowed for certain level of RSSI. Calculating the first and/or second target gain level based on the RSSIs of the first and second signals respectively comprises for example averaging the measured power over all samples in time domain and multiplying by the applied gain.

Signal to interference level measurements comprise for example measurement estimates of signal to interference level. The first and/or second target gain level may be determined based on the signal to interference level measurements so that the target gain level is chosen as high as the signal-to-interference level is needed.

According to some aspects, the step of determining the first and/or second target gain level comprises obtaining measurements indicative of received signal quality for the first and/or second frequency range; and comparing the measurements with a criterion (such as a signal quality interval criterion), and determining the first and/or second target gain level when the measurements do not comply with the criterion.

The method 200 comprises setting S3 a gain GA of the common amplifier module 302 and a gain GRx1 in the first receiver chain 310 and a gain GRx2 in the second receiver chain 320 based on the first target gain level and the second target gain level. For example, the step of setting S3 comprises determining the gain GA, the gain GRx1, the gain GRx2 based on the first and second target level and applying the determined gains GA, GRx1, GRx2 to the corresponding module or receiver chain. The step of setting S3 comprises for example adjusting the gain GA, the gain GRx1, the gain GRx2 such that the first target gain level and/or the second target gain level are reached. Stated differently, the gains GA, GRx1 and GRx2 are applied, set or adjusted to maintain an output level that satisfy a set of SNR criteria and is within an acceptable range for e.g. analog-to-digital converter modules in the receiver chains, and/or digital sections in the receiver chains. Setting S3 comprises for example applying the gain GA at the common amplifier module 302 and the gain GRx1 at the first receiver chain 310 and the gain GRx2 at the second receiver chain 320 to obtain adjusted received first and second signals. This for example results in received signals with adjusted amplitude so that the received signals can be processed by a following module in a processing path. For example, the present disclosure allows satisfying the requirement specifications for the secondary carrier components in the 3GPP-specified power imbalance test where the power level of the primary carrier component is high and set to −25 dBm and the power level of the secondary carrier component is low and set to −72 dBm for 10 MHz bandwidth.

According to some aspects, setting S3 the gain GA of the common amplifier module 302 and the gain GRx1 in the first receiver chain 310 and the gain GRx2 in the second receiver chain 320 based on the first target gain level and the second target gain level comprises determining S31 whether the first and second target gain levels are obtainable by setting the gain GA, the gain GRx1, and the gain GRx2 within a predetermined operating gain range of the common amplifier module 302, a predetermined operating gain range of the first receiver chain 310 and a predetermined operating gain range of the second receiver chain 320 respectively. Setting S3 the gain GA of the common amplifier module 302 and the gain GRx1 in the first receiver chain 310 and the gain GRx2 in the second receiver chain 320 based on the first target gain level and the second target gain level aims at determining the gain GA of the common amplifier module 302 and the gain GRx1 in the first receiver chain 310 and the gain GRx2 in the second receiver chain 320 that are within their respective operating gain ranges and achieve the first and second target gain levels. Determining S31 involves for example determining whether the first and second target gain levels may be obtained, achieved, or reached by setting the gain GA, the gain GRx1, and the gain GRx2 within a predetermined operating gain range of the common amplifier module 302, a predetermined operating gain range of the first receiver chain 310 and a predetermined operating gain range of the second receiver chain 320 respectively. Stated differently, determining S31 comprises determining whether the gains GA, GRx1, and GRx2 may be set within their respective operating gain ranges. For example, the wireless receiver 300 determines whether it is possible to obtain the target levels by setting the gains within their respective predetermined operating gain ranges. The common amplifier module 302 has a predetermined operating gain range, which corresponds to a dynamic range over which the common amplifier module provides linear operation. A lower limit of the predetermined operating gain range of the common amplifier module 302 may be limited by the implementation complexity, and an upper limit of the predetermined operating gain range of the common amplifier module 302 may be chosen to keep linear gain and acceptable noise figure for the input signals, which may be received according to specification requirements. The first receiver chain 310 has a predetermined operating gain range, which corresponds to a dynamic range over which the first receiver chain 310 or a module of the first receiver chain (such as an amplifier module, an ADC module, a digital section) operates. The second receiver chain 320 has a predetermined operating gain range, which corresponds to a dynamic range over which the second receiver chain 320, or a module of the second receiver chain (such as an amplifier module, an ADC module, a digital section) operates. A lower limit of the predetermined operating gain range of an ADC module depends on the thermal noise and ADC noise (such as quantization noise, and other residual errors), and an upper limit of the predetermined operating gain range of an ADC module is based on a saturation level above which clipping of the signal occurs. A lower limit of the predetermined operating gain range of a digital section depends on the quantization noise, and an upper limit of the predetermined operating gain range of a digital section is based on saturation, such as bit-width saturation. Overall limits appear as a result of compromise between performance requirements and implementation complexity/cost. Determining S31 whether the first and second target gain levels are obtainable by setting the gain GA, the gain GRx1, and the gain GRx2 within their respective predetermined operating gain ranges reduces the risk of impairments occurring when operating outside the operating gain range of the module or chain, such as clipping of the received signal, and non-linearity of the module.

According to some aspects, when it is determined that the first and second target gain levels are obtainable by setting the gain GA, the gain GRx1, and the gain GRx2 within the predetermined operating gain range of the common amplifier module 302, the predetermined operating gain range of the first receiver chain 310 and the predetermined operating gain range of the second receiver chain 320 respectively, the step of setting S3 comprises setting S32 the gain GA, the gain GRx1, and the gain GRx2 within their respective operating gain ranges according to the first target gain level and the second target gain level. For example, when it is determined that the gains to be set GA, GRx1, and GRx2 are within their respective predetermined operating gain ranges, the wireless receiver 300 sets or adjusts the gains GA, GRx1, and GRx2 such that the target gain levels are achieved or obtained for each receiver chain, and the acceptable operating gain ranges of each receiver chain (such as of a module having a variable gain in the receiver chain) are respected. This provides an optimal processing of the signals received on the first frequency range and the second frequency, i.e. the risk of clipping, power consumption at the common amplifier module are reduced while satisfying the SNR criteria for both frequency ranges.

In an illustrative example where the proposed technique is applied, the wireless receiver 300 generates power measurements, (such as wideband power measurements) after filtering (such as after wideband filtering) and ADC, and compares the power measurements with a criterion (such as an allowed interval for wideband power measurements), and determines the first and/or second target gain level when the measurements do not comply with the criterion. For example the wireless receiver 300 determines the difference between power measurements and e.g. a middle of the allowed interval, which is taken as an input to setting or adjusting the gain. It shall be taken into account that, the loss due to split constructively is compensated by so called negative resistors. The loss due to split and compensation by negative resistors is constant and are not considered in calculation of the total gain.

In this example, it is assumed, that the wireless receiver maintains a TG table which associates a total analog gain value with an index, e.g. as in table 1:

TABLE 1

TG Table

| TG_Index: FTGL_Index, STGL_Index | Gain (dB) |
|---|---|
| 1 | 47 |
| 2 | 41 |
| 3 | 35 |
| 4 | 29 |
| 5 | 23 |
| 6 | 17 |
| 7 | 11 |

The total analog gain $TG_1$ applied in the first path comprising the common amplifier module 302 and the first receiver chain 310 can be computed e.g. as follows:

$$TG_1 = \text{Max\_gain\_dB} - (\text{Index} - 1) * \text{gain\_step\_dB} \quad (0)$$

Where Max_gain_dB denotes the maximum total gain achievable by the first path, including the common amplifier and first receiver chain. (47 dB in this example), Index denotes the index associated with the corresponding total gain state of the first path including the common amplifier and first receiver chain. And gain_step_dB denotes an absolute value of the step between each gain state (6 dB in this example). In this example, $TG_1=47-(2-1)*6=41$ dB corresponding to Index=2 in the TG table. A similar approach can be applied to the second receiver chain, . . . , and to the Nth receiver chain.

In the example, it is assumed that the common amplifier module 302 has a predetermined operating gain providing 3 gain states, including a maximum gain and two lower gains with the gain step, equal 6 dB. The wireless receiver 300 associates the gain states compared to maximum gain of the common amplifier module 302 to indexes in e.g. a GA table providing:

TABLE 2

| GA Table | |
|---|---|
| GA_Index | Gain GA (dB) |
| 1 | 47 |
| 2 | 41 |
| 3 | 35 |

A gain GRX1_M in a first module of the first receiver chain and a gain GRX2_M in a second module of the second receiver chain are provided by passive mixing modules, which actually add attenuation. A first module of the first receiver chain has a predetermined operating gain providing 5 gain states (high or 0 dB, −6 dB, −12 dB, −18 dB, −24 dB) and a second module of the second receiver chain has a predetermined operating gain providing 5 gain states (high or 0 dB, −6 dB, −12 dB, −18 dB, −24 dB). The wireless receiver 300 associates the gain states of the first/second module (such as a first/second mixing module) in the first/second receiver chain to indexes in e.g. a GRx chain table providing:

TABLE 3

| GRx/GRx_M Table | |
|---|---|
| GRx_Index/ GRx_M_ Index | Gain GRx/GRx_M (dB) |
| 0 | 0 |
| 1 | −6 |
| 2 | −12 |
| 3 | −18 |
| 4 | −24 |

For example, the wireless receiver 300 determines the first target gain level, FTGL, to be 41 dB based on power measurements and determines the second target gain level, STGL, to be 17 dB based on power measurements.

The FTGL of 41 dB corresponds to Index 2 (FTGL_Index=2) and the STGL of 17 dB corresponds to Index 6 (STGL_Index=6). The wireless receiver 300 determines whether the FTGL and STGL are obtainable with gains GA, GRx1 and GRx2 that are within their respective operating gain ranges. To do so, the wireless receiver 300 verifies if a gain for the common amplifier module 302 can be found so that both gain requests are satisfied, by computing |FTGL_Index−STGL_Index|<$N_M$, where $N_M$ denotes the number of gain states of the module in the receiver chain. In this example, $N_M$=5 so |2 −6|<5 shows that gains can be found within their respective operating gain ranges. Then, the wireless receiver 300 determines the gain GA of the common amplifier module 302 in the following exemplary way:

$$GA\_Index = \min(Min\_Index, N_{CA}) \quad (1)$$

Where Min_Index is defined as follows:

$$Min\_index = \min(FTGL\_Index, STGL\_Index) \quad (2)$$

where $N_{CA}$ denotes the number of gain states of the common amplifier module in the receiver chain ($N_{CA}$=3 in this example). The wireless receiver 300 determines that GA_Index=2, which corresponds to GA=41 dB in the GA table. This achieves an objective of setting the gain GA of the common amplifier module as low as possible. If the common amplifier module is constructed so that power consumption depends on the gain value, a decreased gain GA of the common amplifier module would result in also a reduced power consumption.

The wireless receiver 300 determines the gains GRx1_M of the first module of the first receiver chain 310 and GRx2_M of the second module of the second receiver chain 320 e.g. as follows:

$$GRx1\_M\_Index(FTGL,STGL) = FTGL\_Index - GA\_Index \quad (3)$$

$$GRx2\_M\_Index(FTGL,STGL) = STGL\_Index - GA\_Index \quad (4)$$

In this example, the wireless receiver 300 determines that GRx1_M_Index=2 −2=0, which corresponds to a gain GRx1_M of the first module of the first receiver chain 310 of 0 dB in the GRx table. The wireless receiver 300 determines that GRx2_M_Index=6 −2=4, which corresponds to a gain GRx2_M of the second module of the second receiver chain 320 of −24 dB in the GRx table. The first target gain level FTGL=41 dB is achieved for the first path comprising the common amplifier module 302 and the first receiver chain 310 by setting the gain GA to 41 dB and the gain GRx1 or GRx1_M to 0 dB. The second target gain level STGL=17 dB is achieved for the second path comprising the common amplifier module 302 and the second receiver chain 320 by setting the gain GA to 41 dB and the gain GRx2 or GRx2_M to −24 dB. This way, both target levels are achieved, clipping is avoided, and the gains are set at the corresponding modules or chains within their respective operating gain ranges. In particular, the gain of common amplifier module is not kept at the maximum level during operation (in our example 47 dB), but set as high as needed to satisfy the target gain level of the weaker signal (in our case 41 dB), which leads to reduction of power consumption, if power consumption depends on the gain level of the common amplifier.

According to some aspects, when it is determined that the first and second target gain levels are not obtainable by setting the gain GA, the gain GRx1, and the gain GRx2 within the predetermined operating gain range of the common amplifier module 302, the predetermined operating gain range of the first receiver chain 310 and the predetermined operating gain range of the second receiver chain 320 respectively, the step of setting S3 further comprises prioritizing S33 one of the first and second receiver chains 310, 320 based on one or more criteria related to the first and second signal; and setting S34 the gain GA, the gain GRx1 or GRx2 of the prioritized receiver chain 310, 320, according to the target gain level for a path including the prioritized receiver chain 310, 320 and the predetermined operating gain range of the common amplifier module 302 and of the prioritized receiver chain 310, 320. For example, the wireless receiver 300 determines that the FTGL is 11 dB (FTGL_Index=7) and the STGL is 0 dB (STGL_Index=1). The wireless receiver 300 in this example determines that the FTGL and STGL are not obtainable by setting the gains GA, GRx1, and GRx2 within their respective operating gain ranges by computing |FTGL_Index−STGL_Index|<$N_M$, where $N_M$ denotes the number of gain states of the module in the receiver chain. In this example, $N_M$=5 and |7−1|=6 which is larger than 5, the number of gain states of a module in any of the receiver chains. This shows that a gain for the common amplifier module 302 cannot be found satisfying the FTGL and STGL. When a difference between a FTGL_Index and a STGL_Index is equal or larger than the number of gain states for a module in a receiver chain, then the gain GA is for example computed based on FTGL_Index, if the first receiver chain is prioritized, e.g. according to the following:

$$GA\_Index=\min(FTGL\_Index, N_{CA}) \quad (10)$$

For example, the wireless receiver 300 determines if FTGL_Index is smaller than a STGL_Index. If FTGL_Index is smaller than a STGL_Index, the GRx2_M_Index is equal to the number of gain states of the module in the second receiver chain, i.e. maximum attenuation is applied in the second receiver chain. If FTGL_Index is not smaller than a STGL_Index, the GRx2_M_Index is set to 0, i.e. there is no attenuation in the second receiver chain.

According to some aspects, the wireless receiver 300 has to prioritize one receiver chain over the other, i.e. one frequency range over the other. According to some aspects, prioritizing S33 one of the first and second receiver chains 310, 320 based on one or more criteria related to the first and second signal, the one or more criteria related to the first and second signals comprising a signal type, a signal bandwidth, a signal power and/or a signal to noise ratio. According to some aspects, the wireless receiver 300 is an LTE receiver adapted to perform carrier aggregation of received signals, and the first and second signals are first and second LTE carrier components.

For example, the signal type comprises a primary carrier component, and/or a secondary carrier component. The wireless receiver 300 prioritizing based on the signal type prioritizes for example the target gain level corresponding to the primary carrier component, as in LTE the primary serving cell transmitting primary carrier components to the wireless receiver 300 handles the radio resource control, RRC, connection and loss of the RRC connection leads to loss of secondary carrier component reception. Optionally, the wireless receiver 300 prioritizing based on the signal conditions, such as signal bandwidth, signal power and/or signal to noise ratio prioritizes for example the target gain level corresponding to the frequency range that provides the most favorable conditions (e.g. bandwidth, power, SNR).

According to some aspects, the step of setting S3 further comprises setting S35 a gain of a non-prioritized receiver chain 310, 320, GRx1 or GRx2, with a minimum error between a combination of the gain GA of the common amplifier module 302 and of the gain of the non-prioritized receiver chain 310, 320, GRx1 or GRx2 and a target gain level for a path including the non-prioritized receiver chain 310, 320. For example, the wireless receiver 300 prioritizes the first receiver chain 310 over the second receiver chain 320 and sets the gain of a non-prioritized receiver chain 320, GRx2, with a minimum error between a combination of the gains GA+GRx2 and the second target gain level STGL. Namely, the wireless receiver 300 sets the gain GRx2 of a non-prioritized receiver chain 320 such that the combination of the gains GA+GRx2 is as close as possible to the second target gain level STGL.

According to some aspects, each of the first and second receiver chains 310, 320 comprises an analog section 311, 321 and a digital section 341, 351. Setting S3 the gain GRx1, GRx2 of the first and of the second receiver chains 310, 320 comprises setting S36, for each receiver chain 310, 320, a gain in the analog section 311, 321 of the receiver chain and/or a gain in the digital section 341, 351 of the receiver chain 310, 320. Setting S36 a gain in the analog section 311, 321 comprises setting a gain of an analog module comprised in the receiver chain (such as a filter module 3113, 3213, an amplifier module 3111, 3211, a mixing module 3112, 3212). According to some aspects, setting S36 the gain in the analog section 311, 321 of the receiver chain comprises setting S37 a gain in one or more of a mixing module 3112, 3212 and an amplifier module 3111, 3211 of the receiver chain 310, 320. Setting S36 a gain in the digital section 341, 351 comprises for example controlling a digital gain, such as scaling a digital signal. Controlling the digital gain of the digital section 341, 351 involves for example keeping of a digital signal in a range at the end of digital front-end, which is responsible for decimation and filtering of the signal in digital domain. In other words, controlling the digital gain involves scaling the signal in the time domain, i.e. the signal in the time domain shall occupy certain number of bits. Measurements for determining the digital gain are for example performed at an end of the digital section (such as a digital front-end).

According to some aspects, any of the steps of methods 200 are performed in a search phase where the gains are initialized, and/or in a regular phase where the gains are determined and set.

FIG. 3 shows a wireless communication device 600 comprising a wireless receiver 300 according to some aspects of this disclosure. The wireless device 600 comprises for example baseband processing circuitry 601 and at least one memory unit or circuitry 602 that is in communication with the wireless receiver 300. The memory may be configured to store received or transmitted data and/or executable program instructions. The memory may also be configured to store any form of gain parameters, measurements, and/or operating gain range information. The memory may be any suitable type of computer readable memory and may be of volatile and/or non-volatile type. The wireless device 600 further comprise further processing circuitry (not shown) that may be any suitable type of computation unit, e.g. a microprocessor, digital signal processor, DSP, field programmable gate array, FPGA, or application specific integrated circuit, ASIC, or any other form of circuitry to carry out the methods disclosed herein. It should be appreciated that the processing circuitry need not be provided as a single unit but may be provided as any number of units or circuitry. FIG. 3 shows a wireless receiver 300 according to aspects of this disclosure. The wireless receiver 300 comprises a front end module 301, and a common amplifier module 302 operatively connected to the front end module 301. The front end module 301 is for example implemented as a duplexer module in FDD mode, or as radio frequency, RF, filter module in TDD mode. The common amplifier module 302 comprises for example a low noise amplifier module.

The wireless receiver 300 comprises a first receiver chain 310 operatively connected to the common amplifier module 302 to receive a first signal in a first frequency range; and a second receiver chain 320 operatively connected to the common amplifier module 302 to receive a second signal in a second frequency range. The wireless receiver 300 may comprise a third receiver chain, a fourth receiver chain, . . . , an Nth receiver chain, each receiver chain processing signals received in different frequency ranges.

The first frequency range corresponds for example to N component carriers in LTE-Advanced, while the second frequency range corresponds for example to M component carriers. According to some aspects, N component carriers in the first frequency range and M component carriers in the second frequency range are intra band non-contiguous, or inter band non-contiguous carrier aggregation components with respect to 3GPP specification. The N component carriers in the first frequency range can include one primary component carrier and (N−1) secondary component carriers. The primary component carrier and (N−1) secondary component carriers can be considered as intra band contiguous carrier aggregation components. The M component carriers in the second frequency range are secondary component carriers and can be considered as intra band contiguous carrier aggregation components as well.

In an illustrative example where the proposed technique is applicable, the wireless receiver can processes N+M carrier components so that center frequency of a mixing module in the first receiver chain is located in the middle of the frequency range for N contiguous component carriers, and center frequency of a mixing module in the second receiver chain is located in the middle of the frequency range for M contiguous component carriers. Further filtering of the carriers may be done after ADC with the use of digital multiplier modules and filter modules. Alternatively, the receiver may use N+M analog mixing modules and corresponding receiver chains for processing of M+N carrier components.

Each of the common amplifier module 302 and the first and second receiver chains 310, 320 has a variable gain.

The wireless receiver 300 further comprises a controller module 500 adapted to determine a first target gain level for a first path comprising the common amplifier module 302 and the first receiver chain 310 and a second target gain level for a second path comprising the common amplifier module 302 and the second receiver chain 320. Hence according to some aspects, the controller module comprises a determine module 501 configured to determine the first target gain level and the second target gain level. According to some aspects, each receiver chain 310, 320 is associated with a measurement module 330 adapted to perform one or more of power measurements, signal quality measurements and signal to interference level measurements for the receiver chain 310, 320. The wireless receiver 300 comprises for example the measurement module 330. The measurement module 330 provides for example the one or more of power measurements, signal quality measurements and signal to interference level measurements to the controller module 500. According to some aspects, the measurement module 330 comprises a first measurement module 331 associated to the first receiver chain 310 and a second measurement module 332 associated to the second receiver chain 320. The first measurement module 331 performs for example measurements on the first signals received over the first frequency range while the second measurement module 332 performs for example measurements on the second signals received over the second frequency range. For example in LTE CA, the first measurement module 331 measures the total power of N carrier component, CCs, and the second measurement module 332 measures the total power of M CCs. Optionally, the wireless receiver comprises (N+M) measurement modules to measure the power of the (N+M) CCs. The controller module 500 is adapted to determine the first target gain level and the second target gain level based on one or more of power measurements, signal quality measurements and signal to interference level measurements for each receiver chain 310, 320. For example in LTE CA, the controller module 500 sets the gain GA of the common amplifier module 302 and the gain GRx1 of the first receiver chain 310 according to the power of the N CCs measured by the first measurement module 331 and sets the gain GRx2 of the second receiver chain 320 according to the power of the M CCs measured by the second measurement module 332, taking into account the gain GA set to the common amplifier module 302. Optionally, the controller module 500 sets the gain GA of the common amplifier module 302 and the gains GRx1 . . . GRxN of the N receiver chains according to the N power measurements of each of the N CCs measured by the N measurement modules and sets the gain GRx(N+1) . . . GRx(N+M) of the (N+1) to (N+M) receiver chains according to the M power measurements of each of the M CCs measured by the (N+1) to (N+M) measurement modules, taking into account the gain GA set to the common amplifier module.

The controller module 500 is adapted to set a gain GA of the common amplifier module 302 and a gain GRx1 in the first receiver chain 310 and a gain GRx2 in the second receiver chain 320 based on the first target gain level and the second target gain level. Hence, the controller module 500 comprises according to some aspects a set module 502 configured to set the gains GA, GRx1, GRx2 according to the first and second target gain level. For example, the controller module 500 sets the gains GA, GRx1, GRx2 by determining the gains GA, GRx1, GRx2 based on the first and second target level and by applying the determined gains GA, GRx1, GRx2 to the corresponding module or receiver chain. In other words, the controller module 500 applies, sets or adjusts the gains GA, GRx1 and GRx2 to maintain an output level that satisfy a set of SNR criteria and is within an acceptable range for e.g. analog-to-digital converter modules in the receiver chains, and/or digital sections in the receiver chains.

According to some aspects, the common amplifier module 302 and each receiver chain 310, 320 have a predetermined operating gain range. The common amplifier module 302 has a predetermined operating gain range, which corresponds to a dynamic range over which the common amplifier module provides linear operation. The predetermined operating gain range of the common amplifier module 302 has a lower limit that may depend on implementation cost, and an upper limit that may depend on requirements for noise figure and gain linearity for a specified set of input signals. The first receiver chain 310 has a predetermined operating gain range, which corresponds to a dynamic range over which the first receiver chain 310 or a module of the first receiver chain (such as an amplifier module, an ADC module, a digital section) operates. The second receiver chain 320 has a predetermined operating gain range, which corresponds to a dynamic range over which the second receiver chain 320, or a module of the second receiver chain (such as an amplifier module, an ADC module, a digital section) operates. The predetermined operating gain range of an ADC module has a lower limit related to the thermal noise and ADC noise (such as quantization noise, and other residual errors), and an upper limit based on a saturation level above which clipping of the signal occurs. The predetermined operating gain range of a digital section has a lower limit related to the quantization noise, and an upper limit based on saturation, such as bit-width saturation. Overall limits appear as a result of compromise between performance requirements and implementation complexity/cost.

According to some aspects, each receiver chain 310, 320 comprises an analog section 311, 321 and a digital section 341, 351. The analog section 311, 321 and/or the digital section 341, 351 has a variable gain. The digital section comprises according to some aspects, multiplier modules configured to digitally down-convert the signals corresponding to a specified narrow frequency range, a digital channel filter (such as a finite impulse response filter module), a digital amplifier module (such as a scaler module), a narrow band power detector module, a digital gain controller module, which may comprise a part of the controller module. The first receiver chain 310 comprises for example a first analog section 311 and a first digital section 341. The second receiver chain 320 comprises for example a second analog section 321 and a second digital section 351.

According to some aspects, the wireless receiver 300 is an LTE receiver and the first and second signals are first and second LTE carrier components. The first and second frequency ranges correspond to a primary component carrier and a secondary component carrier in LTE-Advanced with carrier aggregation. The first frequency range corresponds to a frequency range used by a radio access network node of a macro cell, and/or micro cell while the second frequency range corresponds to frequency range used by a radio access network node of a macro cell, micro cell, pico cell, and/or femto cell, in LTE-Advanced with dual connectivity.

Figure 4:
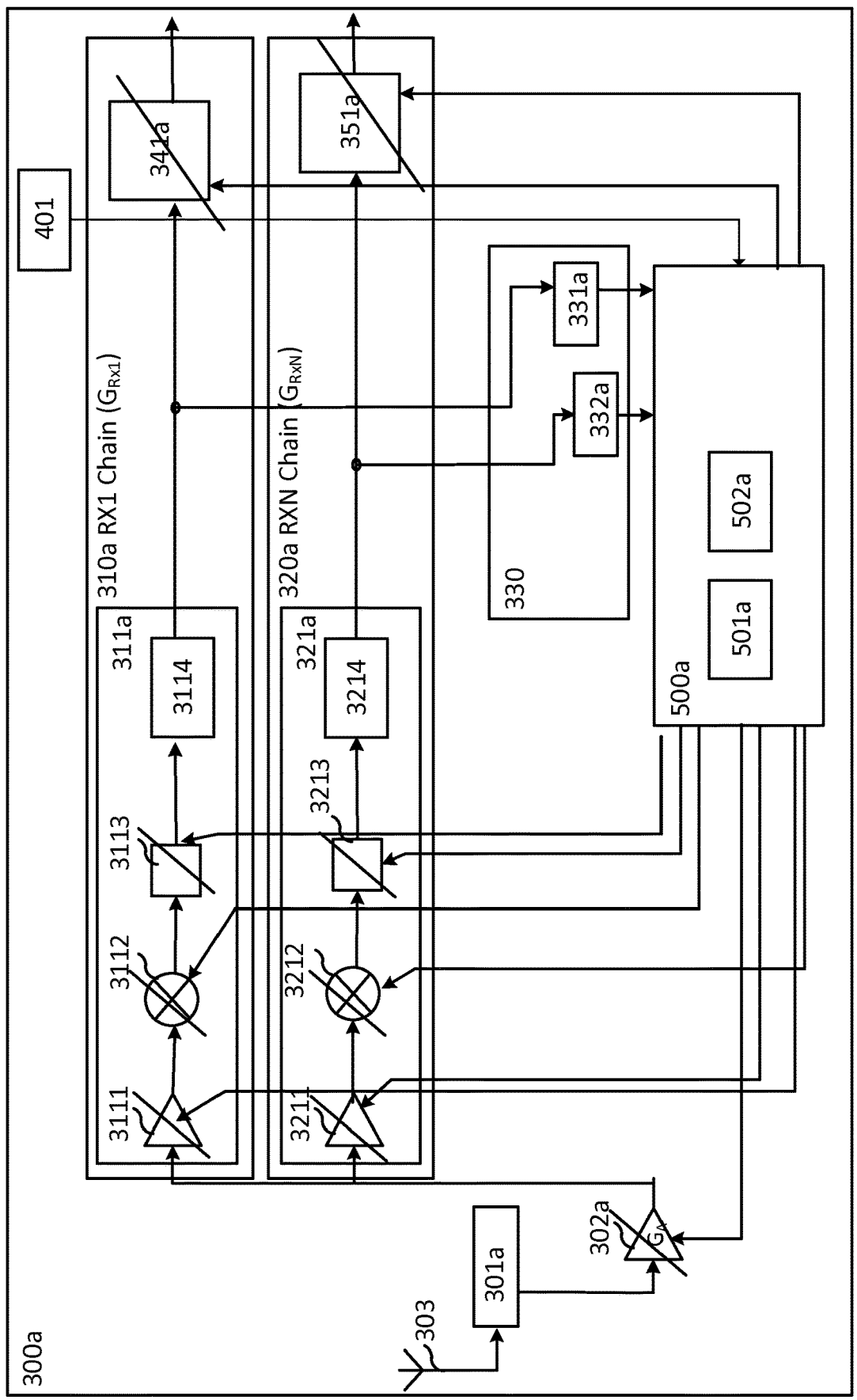
FIG. 4 is a block diagram illustrating an exemplary wireless receiver according to some aspects of the present disclosure.

FIG. 4 shows a block diagram illustrating an exemplary wireless receiver 300a according to some aspects of the present disclosure. The wireless receiver 300a may be described as provided in a wireless communication device 600. The wireless receiver 300a comprises a front end module 301a, an antenna 303 connected to the front end module 301a, and a common amplifier module 302a operatively connected to the front end module 301a. The wireless receiver 300a comprises a first receiver chain 310a operatively connected to the common amplifier module 302a to receive a first signal in a first frequency range; and a second receiver chain 320a operatively connected to the common amplifier module 302a to receive a second signal in a second frequency range. The first frequency range corresponds for example to primary component carrier in LTE-Advanced, while the second frequency range corresponds for example to secondary component carrier. The common amplifier module 302a has a variable gain, i.e. the gain of the common amplifier module 302a can be set or adjusted.

According to some aspects, the analog section 311a, 321a of each receiver chain 310a, 320a comprises a mixing module 3112, 3212, and an amplifier module 3111, 3211. The mixing module 3112, 3212 and/or the amplifier module 3112, 3212 has variable gain. The first receiver chain 310a comprises for example an amplifier module 3111, a mixing module 3112, a filter module 3113 and an ADC module 3114. The second receiver chain 320a comprises for example an amplifier module 3211, a mixing module 3212, a filter module 3213 and an ADC module 3214. The first receiver chain 310a and the second receiver chain 320a have each a variable gain. The filter module 3113, 3213 comprises for example an analog baseband, ABB, filter module, such as a programmed ABB filter module, such as a low pass filter module. Namely, the amplifier module 3111, 3211, the mixing module 3112, 3212, the filter module 3113, 3213 have each a variable gain that can be set by the controller module 500a to achieve a target gain level and comply with the operating gain ranges of each module. It is envisaged that the first receiver chain 310a comprises for example a first analog section 311 comprising the amplifier module 3111, the mixing module 3112, the filter module 3113 and the ADC module 3114; and a first digital section 341a. It is also envisaged that the second receiver chain 320a comprises for example a second analog section 321a comprising the amplifier module 3211, the mixing module 3212, the filter module 3213 and the ADC module 3214; and a second digital section 351a. Each receiver chain comprises according to some aspects an oscillator module operatively connected to the mixing module 3112, 3212, such as a local oscillator module. The wireless receiver 300a further comprises a controller module 500a adapted to determine a first target gain level for a first path comprising the common amplifier module 302a and the first receiver chain 310a and a second target gain level for a second path comprising the common amplifier module 302a and the second receiver chain 320a. The controller module comprises a determine module 501a configured to determine the first target gain level and the second target gain level. The wireless receiver 300 comprises the measurement module 500a, such as a wideband power detector module. Each receiver chain 310a, 320a is operatively connected to a measurement module 330a adapted to perform one or more of power measurements, signal quality measurements and signal to interference level measurements for the receiver chains 310a, 320a independently. The controller module 500 is operatively connected to the measurement module 330a. The measurement module 330a comprises for example a wideband power detector module for each receiver chain 310, 320. The measurement module 330a provides the one or more of power measurements, signal quality measurements and signal to interference level measurements to the controller module 500a. The measurement module 330a comprises a first measurement module 331a associated to the first receiver chain 310a and a second measurement module 332a associated to the second receiver chain 320a. The first measurement module 331a performs for example measurements on the first signals received over the first frequency range while the second measurement module 332a performs for example measurements on the second signals received over the second frequency range. According to some aspects, the controller module 500 is operatively connected to a signal quality measurement module 401 configured to perform signal quality measurements such as SNR, SINR, RSRP, RSRQ. The controller module 500a is adapted to determine the first target gain level and the second target gain level based on one or more of power measurements, signal quality measurements and signal to interference level measurements for each receiver chain 310a, 320a. Measurements such as signal quality measurements and signal to interference level measurements may be obtained by the controller module 500 from a signal quality measurement module 401. The controller module 500a is adapted to set independently each of a gain GA of the common amplifier module 302a and a gain GRx1 in the first receiver chain 310a and a gain GRx2 in the second receiver chain 320a based on the first target gain level and the second target gain level. Hence, the controller module 500a comprises a set module 502a configured to set the gains GA, GRx1, GRx2 according to the first and second target gain level. The controller module 500a sets the gains GA, GRx1, GRx2 by determining the gains GA, GRx1, GRx2 based on the first and second target level and by providing the determined gains GA, GRx1, GRx2 to the corresponding module or receiver chain.

Figure 5:
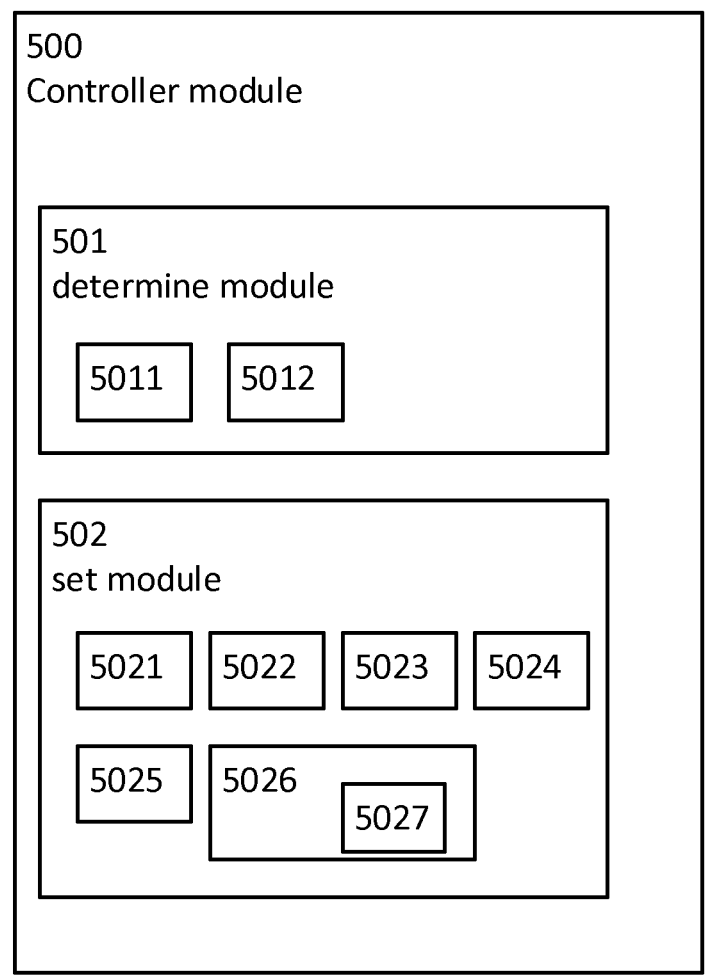
FIG. 5 is a block diagram illustrating a controller module according to some aspects of the present disclosure.

FIG. 5 shows a block diagram of a controller module 500 for use in the wireless receiver 300, 300a disclosed herein adapted to carry out the methods 200 disclosed herein. The controller module 500 is adapted to determine a first target gain level for a first path comprising the common amplifier module 302 and the first receiver chain 310 and a second target gain level for a second path comprising the common amplifier module 302 and the second receiver chain 320. Hence according to some aspects, the controller module comprises a determine module 501 configured to determine the first target gain level and the second target gain level. The determine module 501 comprises for example a determine first target gain level module 5011 configured to determine the first target gain level and a determine second target gain level module 5012 configured to determine the second target gain level. The controller module 500 is adapted to set a gain GA of the common amplifier module 302 and a gain GRx1 in the first receiver chain 310 and a gain GRx2 in the second receiver chain 320 based on the first target gain level and the second target gain level. Hence, the controller module 500 comprises according to some aspects a set module 502 configured to set the gains GA, GRx1, GRx2 according to the first and second target gain level. According to some aspects, the set module 502 comprises a decision module 5021 configured to determining whether the first and second target gain levels are obtainable by setting the gain GA, the gain GRx1, and the gain GRx2 within a predetermined operating gain range of the common amplifier module 302, a predetermined operating gain range of the first receiver chain 310 and a predetermined operating gain range of the second receiver chain 320 respectively. According to some aspects, the set module 502 comprises a setting the gain GA, the gain GRx1, and the gain GRx2 module 5022 configured to set the gains GA, GRx1, and GRx2 within their respective operating gain ranges according to the first target gain level and the second target gain level when it is determined that the first and second target gain levels are obtainable by setting the gain GA, the gain GRx1, and the gain GRx2 within their respective predetermined operating gain ranges. According to some aspects, the set module 502 comprises, when it is determined that the first and second target gain levels are not obtainable by setting the gain GA, the gain GRx1, and the gain GRx2 within the predetermined operating gain range of the common amplifier module 302, the predetermined operating gain range of the first receiver chain 310 and the predetermined operating gain range of the second receiver chain 320 respectively, a prioritize module 5023 configured to prioritize one of the first and second receiver chains 310, 320 based on one or more criteria related to the first and second signal; and set prioritized gain module 5024 configured to set the gain GA, the gain GRx1 or GRx2 of the prioritized receiver chain 310, 320, according to the target gain level for a path including the prioritized receiver chain 310, 320 and the predetermined operating gain range of the common amplifier module 302 and of the prioritized receiver chain 310, 320. The set module 502 for example further comprises a set non-prioritized gain module 5025 configured to set a gain of a non-prioritized receiver chain 310, 320, GRx1 or GRx2, with a minimum error between a combination of the gain GA of the common amplifier module 302 and of the gain of the non-prioritized receiver chain 310, 320, GRx1 or GRx2 and a target gain level for a path including the non-prioritized receiver chain 310, 320. According to some aspects, the set module 502 comprises a set analog gain and digital gain module 5026 configured to set, for each receiver chain 310, 320, a gain in the analog section 311, 321 of the receiver chain and/or a gain in the digital section 341, 351 of the receiver chain 310, 320.

According to some aspects, the set analog gain and digital gain module 5026 comprises a set mixing and amplifier gain module 5027 configured to set a gain in one or more of a mixing module 3112, 3212 and an amplifier module 3111, 3211 of the receiver chain 310, 320.

This disclosure relates to a computer program product comprising a computer readable medium having thereon a computer program for use in the controller module 500, 500a comprising code to enable the controller module 500, 500a to carry out the method steps disclosed herein for gain control.

It should be appreciated that FIGS. 1-5 comprise some operations which are illustrated with a darker border and some operations which are illustrated with a dashed border. The operations or modules which are comprised in a darker border are operations or modules which are comprised in the broadest example embodiment. The operations or modules which are comprised in a dashed border are example embodiments which may be comprised in, or a part of, or are further operations or modules which may be taken in addition to the operations or modules of the darker border example embodiments. It should be appreciated that these operations or modules need not be processed in order. Furthermore, it should be appreciated that not all of the operations need to be performed. The example operations may be performed in any order and in any combination.

It should be appreciated that the example operations of FIG. 2 may be performed simultaneously for any number of device or circuit.

Aspects of the disclosure are described with reference to the drawings, e.g., block diagrams and/or flowcharts. It is understood that several entities in the drawings, e.g., blocks of the block diagrams, and also combinations of entities in the drawings, can be implemented by computer program instructions, which instructions can be stored in a computer-readable memory, and also loaded onto a computer or other programmable data processing apparatus. Such computer program instructions can be provided to a processor of a general purpose computer, a special purpose computer and/or other programmable data processing apparatus to produce a machine, such that the instructions, which execute via the processor of the computer and/or other programmable data processing apparatus, create means for implementing the functions/acts specified in the block diagrams and/or flowchart block or blocks.

In some implementations and according to some aspects of the disclosure, the functions or steps noted in the blocks can occur out of the order noted in the operating illustrations. For example, two blocks shown in succession can in fact be executed substantially concurrently or the blocks can sometimes be executed in the reverse order, depending upon the functionality/acts involved. Also, the functions or steps noted in the blocks can according to some aspects of the disclosure be executed continuously in a loop.

In the drawings and specification, there have been disclosed exemplary aspects of the disclosure. However, many variations and modifications can be made to these aspects without substantially departing from the principles of the present disclosure. Thus, the disclosure should be regarded as illustrative rather than restrictive, and not as being limited to the particular aspects discussed above. Accordingly, although specific terms are employed, they are used in a generic and descriptive sense only and not for purposes of limitation.

It should be noted that although terminology from 3GPP LTE has been used herein to explain the example embodiments, this should not be seen as limiting the scope of the example embodiments to only the aforementioned system. Other wireless systems, including WCDMA, WiMax, UMB and GSM, may also benefit from the example embodiments disclosed herein.

Also note that terminology such as eNodeB and wireless device should be considered as non-limiting and does in particular not imply a certain hierarchical relation between the two. In general "eNodeB" could be considered as device 1 and "wireless device" as device 2, and these two devices communicate with each other over some radio channel. Furthermore, while the example embodiments focus on wireless transmissions in the downlink, it should be appreciated that the example embodiments are equally applicable in the uplink.

The description of the example embodiments provided herein have been presented for purposes of illustration. The description is not intended to be exhaustive or to limit example embodiments to the precise form disclosed, and modifications and variations are possible in light of the above teachings or may be acquired from practice of various alternatives to the provided embodiments. The examples discussed herein were chosen and described in order to explain the principles and the nature of various example embodiments and its practical application to enable one skilled in the art to utilize the example embodiments in various manners and with various modifications as are suited to the particular use contemplated. The features of the embodiments described herein may be combined in all possible combinations of methods, apparatus, modules, systems, and computer program products. It should be appreciated that the example embodiments presented herein may be practiced in any combination with each other.

It should be noted that the word "comprising" does not necessarily exclude the presence of other elements or steps than those listed and the words "a" or "an" preceding an element do not exclude the presence of a plurality of such elements. It should further be noted that any reference signs do not limit the scope of the claims, that the example embodiments may be implemented at least in part by means of both hardware and software, and that several "means", "units" or "devices" may be represented by the same item of hardware.

The various example embodiments described herein are described in the general context of method steps or processes, which may be implemented in one aspect by a computer program product, embodied in a computer-readable medium, including computer-executable instructions, such as program code, executed by computers in networked environments. A computer-readable medium may include removable and non-removable storage devices including, but not limited to, Read Only Memory (ROM), Random Access Memory (RAM), compact discs (CDs), digital versatile discs (DVD), etc. Generally, program modules may include routines, programs, objects, components, data structures, etc. that perform particular tasks or implement particular abstract data types. Computer-executable instructions, associated data structures, and program modules represent examples of program code for executing steps of the methods disclosed herein. The particular sequence of such executable instructions or associated data structures represents examples of corresponding acts for implementing the functions described in such steps or processes.

In the drawings and specification, there have been disclosed exemplary embodiments. However, many variations and modifications can be made to these embodiments. Accordingly, although specific terms are employed, they are used in a generic and descriptive sense only and not for purposes of limitation, the scope of the embodiments being defined by the following claims.

The invention claimed is:

1. A method for gain control in a wireless receiver comprising a first receiver chain adapted to receive a first signal in a first frequency range, a second receiver chain adapted to receive a second signal in a second frequency range, wherein the first and second receiver chains are separate and distinct from each other and each comprise a mixing module and a local oscillator module operatively connected to the mixing module, and a common amplifier module operatively connected to the first receiver chain and the second receiver chain, the method comprising:
   determining a first target gain level for a first path comprising the common amplifier module and the first receiver chain;
   determining a second target gain level for a second path comprising the common amplifier module and the second receiver chain; and
   setting a gain GA of the common amplifier module and a gain GRx1 in the first receiver chain and a gain GRx2 in the second receiver chain based on the first target gain level and the second target gain level after determining the first and second target gain levels.

2. The method of claim 1, wherein determining the first target gain level and determining the second target gain level are based on one or more of power measurements, signal quality measurements and signal to interference level measurements for each receiver chain.

3. The method of claim 1, wherein setting the gain GA of the common amplifier module and the gain GRx1 in the first receiver chain and the gain GRx2 in the second receiver chain based on the first target gain level and the second target gain level comprises determining whether the first and second target gain levels are obtainable by setting the gain GA, the gain GRx1, and the gain GRx2 within a predetermined operating gain range of the common amplifier module, a predetermined operating gain range of the first receiver chain and a predetermined operating gain range of the second receiver chain respectively.

4. The method of claim 3, wherein when it is determined that the first and second target gain levels are obtainable by setting the gain GA, the gain GRx1, and the gain GRx2 within the predetermined operating gain range of the common amplifier module, the predetermined operating gain range of the first receiver chain and the predetermined operating gain range of the second receiver chain respectively, the step of setting comprises setting the gain GA, the gain GRx1, and the gain GRx2 within their respective operating gain ranges according to the first target gain level and the second target gain level.

5. The method of claim 3, wherein when it is determined that the first and second target gain levels are not obtainable by setting the gain GA, the gain GRx1, and the gain GRx2 within the predetermined operating gain range of the common amplifier module, the predetermined operating gain range of the first receiver chain and the predetermined operating gain range of the second receiver chain respectively, the step of setting further comprises:
   prioritizing one of the first and second receiver chains based on one or more criteria related to the first and second signal; and
   setting the gain GA, the gain of the prioritized receiver chain, GRx1 or GRx2 according to the target gain level for a path including the prioritized receiver chain and the predetermined operating gain range of the common amplifier module and of the prioritized receiver chain.

6. The method of claim 5, wherein the step of setting further comprises setting a gain of a non-prioritized receiver chain, GRx1 or GRx2, with a minimum error between a combination of the gain GA of the common amplifier module and of the gain of the non-prioritized receiver chain, GRx1 or GRx2 and a target gain level for a path including the non-prioritized receiver chain.

7. The method of claim 5, wherein the one or more criteria related to the first and second signals comprises a signal type, a signal bandwidth, a signal power and/or a signal to noise ratio.

8. The method of claim 1 wherein each of the first and second receiver chains comprises an analog section and a digital section and wherein setting the gain GRx1 and the gain GRx2 of the first and of the second receiver chains comprises for each receiver chain:
setting a gain in the analog section of the receiver chain and/or a gain in the digital section of the receiver chain.

9. The method of claim 8 wherein setting the gain in the analog section of the receiver chain comprises:
setting a gain in the mixing module and an amplifier module of the receiver chain.

10. The method of claim 1 wherein the wireless receiver is an LTE receiver adapted to perform carrier aggregation of received signals, and the first and second signals are first and second LTE carrier components.

11. A wireless receiver comprising:
a front end module;
a common amplifier module operatively connected to the front end module;
a first receiver chain operatively connected to the common amplifier module to receive a first signal in a first frequency range;
a second receiver chain operatively connected to the common amplifier module to receive a second signal in a second frequency range wherein the first and second receiver chains are separate and distinct from each other and each comprise a mixing module and a local oscillator module operatively connected to the mixing module;
wherein each of the common amplifier module and the first and second receiver chains has a variable gain; and
wherein the wireless receiver further comprises:
a controller module adapted to:
determine a first target gain level for a first path comprising the common amplifier module and the first receiver chain, and determine a second target gain level for a second path comprising the common amplifier module and the second receiver chain; and
set a gain GA of the common amplifier module and a gain GRx1 in the first receiver chain and a gain GRx2 in the second receiver chain based on the first target gain level and the second target gain level after determining the first and second target gain levels.

12. The wireless receiver of claim 11 wherein each receiver chain is associated with a measurement module adapted to perform one or more of power measurements, signal quality measurements and signal to interference level measurements for the receiver chain.

13. The wireless receiver of claim 11 wherein the common amplifier module and each receiver chain have a predetermined operating gain range.

14. The wireless receiver of claim 11 wherein each receiver chain comprises:
an analog section, and
a digital section, wherein the analog section and/or the digital section has a variable gain.

15. The wireless receiver of claim 14 wherein the analog section of each receiver chain comprises the mixing module and an amplifier module,
wherein the mixing module and/or the amplifier module has variable gain.

16. The wireless receiver of claim 11 wherein the wireless receiver is an LTE receiver and the first and second signals are first and second LTE carrier components.

17. A controller module for use in a wireless receiver comprising a front end module, a common amplifier module operatively connected to the front end module, a first receiver chain operatively connected to the common amplifier module to receive a first signal in a first frequency range, and a second receiver chain operatively connected to the common amplifier module to receive a second signal in a second frequency range, wherein each of the common amplifier module and the first and second receiver chains has a variable gain and the first and second receiver chains are separate and distinct from each other and each comprise a mixing module and a local oscillator module operatively connected to the mixing module where the controller module is adapted to:
determine a first target gain level for a first path comprising the common amplifier module and the first receiver chain;
determine a second target gain level for a second path comprising the common amplifier module and the second receiver chain; and
set a gain GA of the common amplifier module and a gain GRx1 in the first receiver chain and a gain GRx2 in the second receiver chain based on the first target gain level and the second target gain level after determining the first and second target gain levels.

18. A computer program product comprising a non-transitory computer readable medium having thereon a computer program for use in a controller module for use in a wireless device, the controller module comprising code to enable the controller module to:
determine a first target gain level for a first path comprising a common amplifier module and a first receiver chain of the wireless device;
determine a second target gain level for a second path comprising the common amplifier module and a second receiver chain of the wireless device, wherein the first and second receiver chains are separate and distinct from each other and each comprise a mixing module and a local oscillator module operatively connected to the mixing module; and
set a gain GA of the common amplifier module and a gain GRx1 in the first receiver chain and a gain GRx2 in the second receiver chain based on the first target gain level and the second target gain level after determining the first and second target gain levels.

19. A wireless communication device comprising a processing circuitry, a memory, and a wireless receiver comprising:
a front end module;
a common amplifier module operatively connected to the front end module;
a first receiver chain operatively connected to the common amplifier module to receive a first signal in a first frequency range;
a second receiver chain operatively connected to the common amplifier module to receive a second signal in a second frequency range wherein the first and second receiver chains are separate and distinct from each other and each comprise a mixing module and a local oscillator module operatively connected to the mixing module;

wherein each of the common amplifier module and the first and second receiver chains has a variable gain; and wherein the wireless receiver further comprises:

a controller module adapted to:
  determine a first target gain level for a first path comprising the common amplifier module and the first receiver chain, and determine a second target gain level for a second path comprising the common amplifier module and the second receiver chain; and
  set a gain GA of the common amplifier module and a gain GRx1 in the first receiver chain and a gain GRx2 in the second receiver chain based on the first target gain level and the second target gain level after determining the first and second target gain levels.

* * * * *